United States Patent [19]

Sheets

[11] Patent Number: 4,940,881

[45] Date of Patent: Jul. 10, 1990

[54] METHOD AND APPARATUS FOR EFFECTING SELECTIVE ABLATION OF A COATING FROM A SUBSTRATE, AND CONTROLLING THE WALL ANGLE OF COATING EDGE PORTIONS

[75] Inventor: Ronald E. Sheets, Santa Ana, Calif.

[73] Assignee: Tamarack Scientific Co., Inc., Anaheim, Calif.

[21] Appl. No.: 413,778

[22] Filed: Sep. 28, 1989

[51] Int. Cl.$^5$ ............................................. B23K 26/00
[52] U.S. Cl. ........................... 219/121.69; 219/121.75; 219/121.79; 219/121.68
[58] Field of Search ....................... 219/121.69, 121.68, 219/121.67, 121.72, 121.74, 121.75, 121.85, 121.78, 121.79; 156/643

[56] References Cited

U.S. PATENT DOCUMENTS

| 4,780,177 | 10/1988 | Wojnarowski et al. ... | 219/121.69 X |
| 4,786,358 | 11/1988 | Yamazaki et al. ................... | 156/643 |
| 4,842,677 | 6/1989 | Wojnarowski et al. ... | 219/121.69 X |
| 4,861,421 | 8/1989 | Bienstock ........................ | 156/643 X |

OTHER PUBLICATIONS

An article entitled, "Excimer Laser Etching of Polyimide", by J. H. Brannon, J. R. Lankard, A. I. Baise, F. Burns, and J. Kaufman, *Journal of Applied Physics*, vol. 58, No. 5, Sep. 1, 1985.

*Primary Examiner*—C. L. Albritton
*Attorney, Agent, or Firm*—Richard L. Gausewitz

[57] ABSTRACT

The angles of the walls of vias being ablated by excimer lasers are controlled by interposing refractive elements between the masks and the workpieces, and rotating the refractive elements about axes parallel to the optical axis. In one embodiment, the refractive element has parallel faces, and is inclined. In another embodiment, the faces of the refractive element are at a small angle to each other.

26 Claims, 5 Drawing Sheets

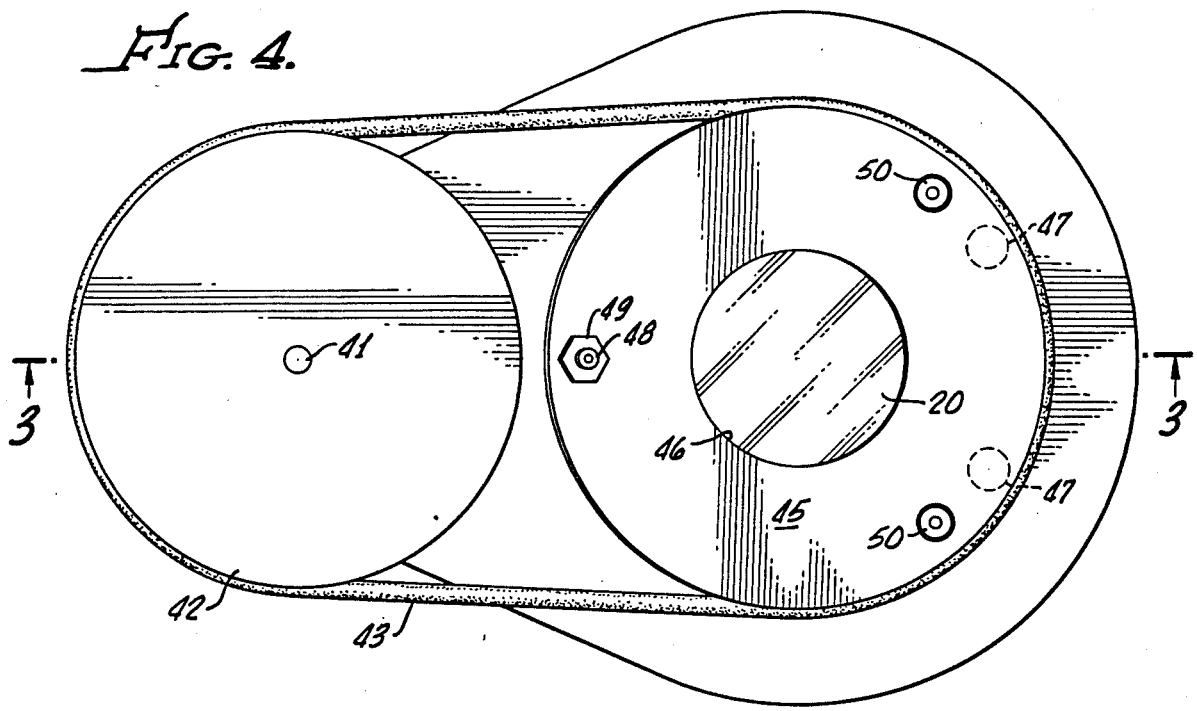
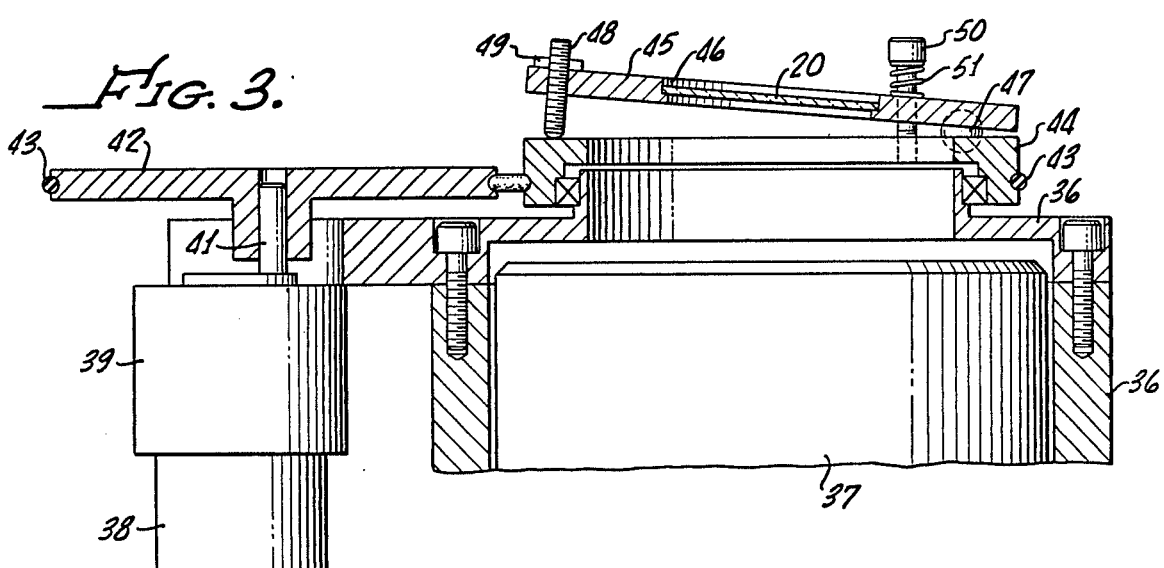
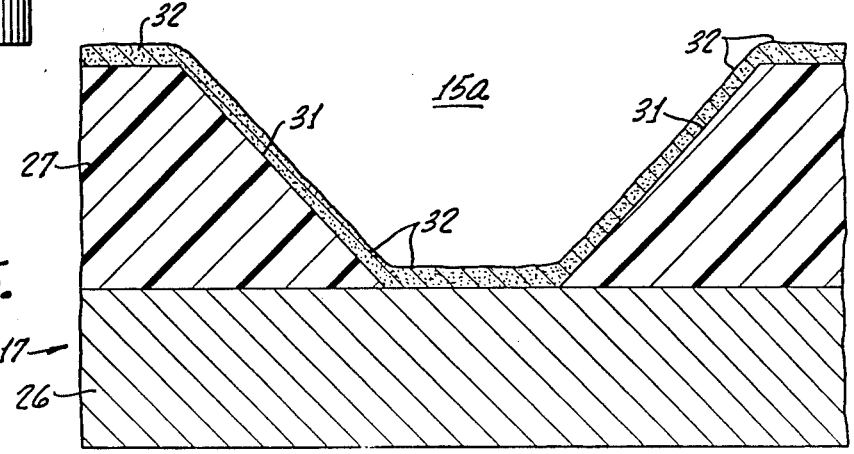

METHOD AND APPARATUS FOR EFFECTING SELECTIVE ABLATION OF A COATING FROM A SUBSTRATE, AND CONTROLLING THE WALL ANGLE OF COATING EDGE PORTIONS

BACKGROUND OF THE INVENTION

In the manufacture of certain products, notably printed circuit boards, it is important that the wall angles of the edges of laser-ablated film portions be correct. For example, if the wall angle of a via is too steep, evaporated metal will not adhere to the wall in amounts sufficient to prevent discontinuities in the electrical circuit. On the other hand, if a via has a wall angle that is too shallow, the via will occupy more space in the circuit board than is necessary.

Prior art workers have attempted to control wall angle by controlling the fluence level in the beam from the excimer laser. Typically, in the ablation process relative to an organic polymer dielectric, the threshold fluence required for ablation is approximately 70 $mJ/cm^2$ per pulse to 100 $mJ/cm^2$ per pulse. The required threshold fluence depends on the particular polymer (such as a polyimide) being ablated (reference is made to "Excimer Laser Etching of Polyimide", by J. H. Brannon, J. R. Lankard, A. I. Baise, F. Burns, and J. Kaufman, *Journal of Applied Physics*, Volume 58, No. 5, 1 Sep. 1985). When the fluence is raised from 1.1 times threshold to 2.0 times threshold, the wall angle increases from about 65° to about 80° from the plane of the board. However, this entire range of angles is undesirably high for the walls of vias in printed circuit boards, in that wall angles in the range of about 45° to about 50° from the plane of the board are generally regarded as optimum.

Prior art workers have also attempted to control wall angle by defocusing the projection lens, but this approach has achieved only limited success. It has been found that in order to have a wall angle of 50° or less, from the plane of the board, the projection lens must be moved far out of focus for a relatively large diameter via, but must be moved only a minor amount out of focus for a small diameter via. Thus, if openings for both large-size vias and small-size vias are required in one mask, a distinct problem is presented. In fact, if small and large openings are provided in a single mask, and the defocusing approach is employed, relatively satisfactory wall angles are provided relative to the large features, but the small or fine features are lost. Resolution capability is thus very severely affected.

SUMMARY OF THE INVENTION

The present method and apparatus are a solution to the above problem, and do not require any defocusing or any variation in the fluence level. Furthermore, the present method and apparatus are very simple and economical, being practical for mass production of parts and with minimum cost and minimum opportunity for breakdown. Control of wall angle may be achieved, with the present method and apparatus, by making either manual adjustments to the apparatus or computer-controlled adjustments thereto.

In the preferred embodiment, a thin transparent disc having parallel faces or surfaces is disposed in the path of the laser beam, and is tilted to a small angle to a reference plane that is perpendicular to the optical axis. In addition, the disc is rotated in such manner as to remain at the small angle to the reference plane. The rotation is not about the axis of the disc, but instead (preferably) about the optical axis or an axis parallel to it. Such rotation of the disc displaces each part of each pulse-generated image with respect to the same image part generated by the previous pulse of laser energy. The combination of the offset of the beam by tilting the disc relative to the optical axis, and the motion of the offset image effected by rotating the disc, achieves a highly effective and controllable way of determining the wall angle at the edge portion of a film being ablated by an excimer laser. To change the wall angle at the edge of a film, for example the wall angle of a via in a film adhered to a substrate, the angle of the disc relative to the reference plane is varied within a critical range.

In accordance with a second embodiment of the invention, a prism is employed in place of the disc having parallel faces. The nonparallel faces of the prism are caused to be at a small angle to each other. The prism is rotated, similarly to the rotation of the above-indicated disc, to cause displacement of each part of each pulse-generated image. The angle between the faces, and other factors, are such that the image is not defocused. To change the amount of displacement, and thus the wall angle at edge regions of a film, the distance between the prism and the mask is varied. Alternatively, or additionally, the amount of displacement is varied by tilting the prism.

BRIEF DESCRIPTION OF THE DRAWINGS

FIG. 3 is a sectional view, on line 3—3 of FIG. 4, showing a and disc-operating mechanism;

FIG. 4 is a top plan view of the showing of FIG. 3;

FIG. 5 is a greatly enlarged vertical sectional view of a portion of a printed circuit board, indicating one of the vias, background lines being omitted for clarity of illustration;

DETAILED DESCRIPTION OF THE PREFERRED EMBODIMENT

Figure 1:
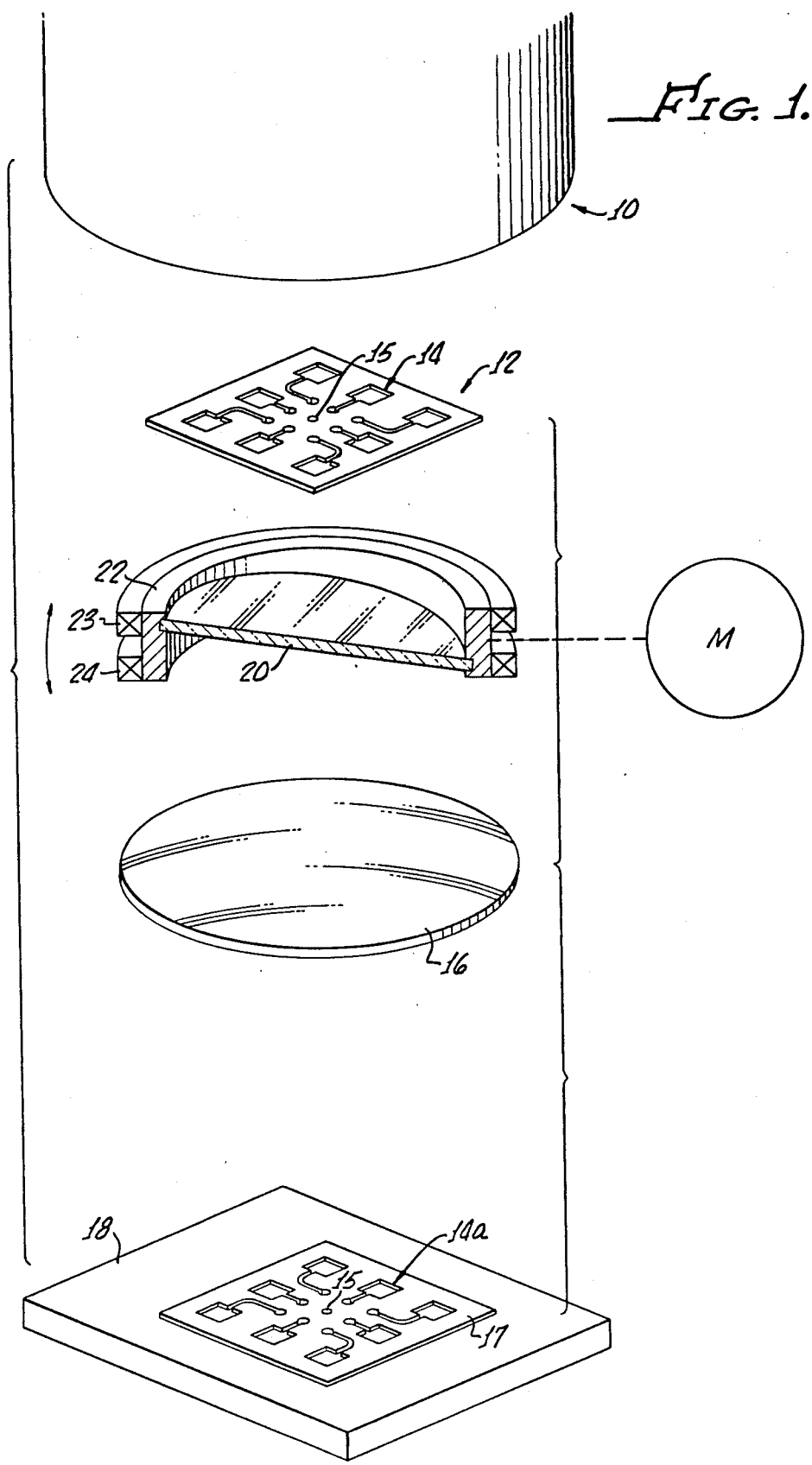
FIG. 1 is a view indicating schematically the apparatus of a preferred embodiment of the present invention.

Referring to FIG. 1, there is shown in schematic form the various components of a preferred embodiment of the present invention. Thus, an excimer laser 10 is represented as being disposed to project a laser beam onto and through a mask 12, the threshold fluence relative to the mask being much greater than the fluence of the beam There is formed in mask 12 a pattern of holes and/or openings 14 It is to be understood that the indicated pattern is merely exemplary; the actual pattern may comprise any desired variety and number of locations, shapes and sizes of openings.

At the center of mask 14 is shown a round or circular hole 15 which is provided as an aid to explanation of the optics of the present system.

The portions of the beam that pass through openings 14, 15 travel through a projection lens 16 that is adapted to sharply focus the mask image on a workpiece 17. In the present example, lens 16 is 1:1. The workpiece is positioned on a worktable 18 that is adjustable in position, it being however understood that the table is not moved while workpiece 17 is being processed.

In the present illustration, workpiece 17 is a circuit board comprising a substrate having an organic polymer coating thereon as described subsequently, and from which it is desired to ablate via (or other) openings so that (for example) electrical connections may later be made to another layer of the circuit board. Various substrates may be employed, for example metallic or dielectric. The dielectrics may include (for example) ceramics with or without metal coatings. They may also include fiberglass, Kapton, Mylar, etc.

There is disposed between mask 12 and workpiece 17, preferably between such mask and lens 16, a flat transparent refracting disc 20 that is disposed transversely to the optical axis of the laser and lens system. The disc has upper and lower faces or surfaces that lie in planes parallel to each other. Disc 20 is sufficiently large, and is so located, that all portions of the beam pass through mask 12 and also pass through the disc.

The disc 20 is thin, preferably having a thickness in the range of about $\frac{1}{2}$ mm to about 3 mm. Very importantly, disc 20 is inclined or tilted relative to a reference plane that is perpendicular to the optical axis of the laser-lens system. The combination of the disc 20 and incline causes each component of the laser beam to be refracted and thus offset, the offset being slight because of the thinness of the disc. Also because of the thinness, and because the disc is preferably formed of quartz, there is minimum absorption of ultraviolet light from the excimer laser 10.

Means are provided to rotate disc 20 about an axis that is preferably parallel to or coincident with the optical axis of the laser and lens, while at all times maintaining the disc at the same angle to the stated reference plane. In FIG. 1, the means for effecting rotation is indicated schematically as being a motor M that drives a ring 22 in which is mounted the peripheral region of disc 20, the ring being supported in bearings 23, 24. (The actual construction of a preferred embodiment of the disc-supporting, rotating and adjusting means is set forth below relative to FIGS. 3 and 4.)

It is to be understood that suitable support and adjustment means, not shown, are provided for laser 10, mask 12, bearings 23-24, lens 16, and worktable 18, and that such means hold the specified elements in desired relationships such as those indicated schematically in FIG. 1.

Very preferably, the relationships are caused to be such that the image of openings 14, 15 in mask 12 is sharply focused on the upper surface of workpiece 17.

DESCRIPTION OF THE METHOD

Figure 2:
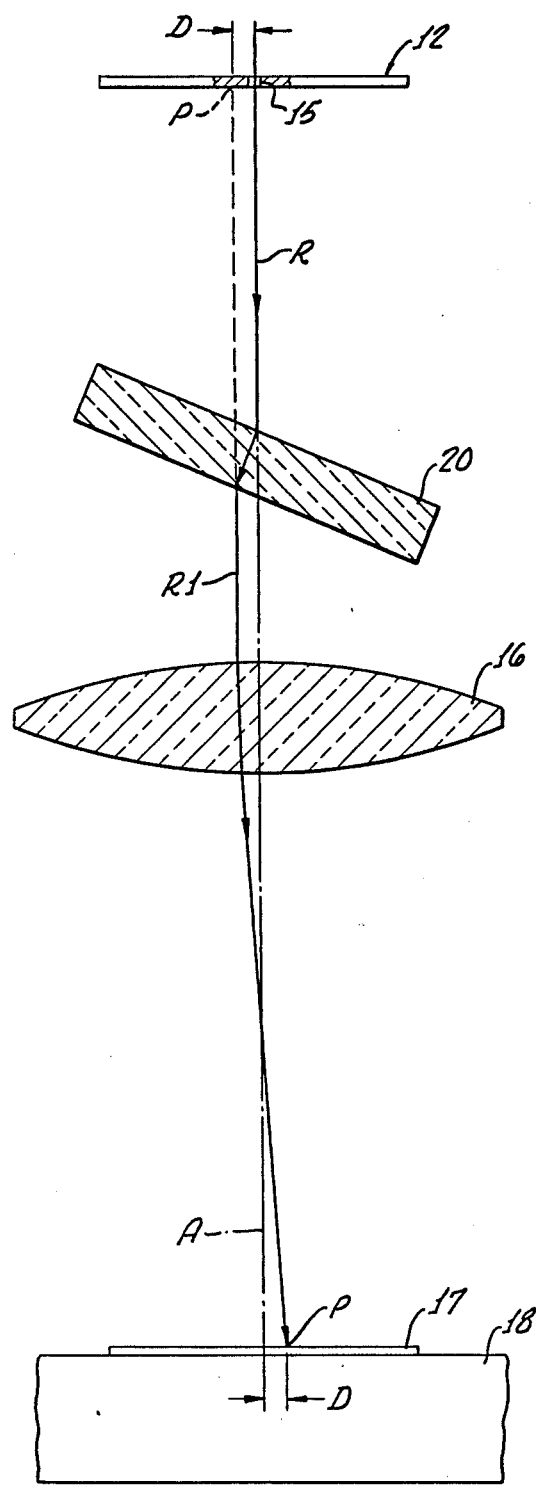
FIG. 2 diagrammatic drawing, not to scale, showing in exaggerated generalized manner the optics of such preferred embodiment which the disc is in one tilted condition.
Figure 2A:
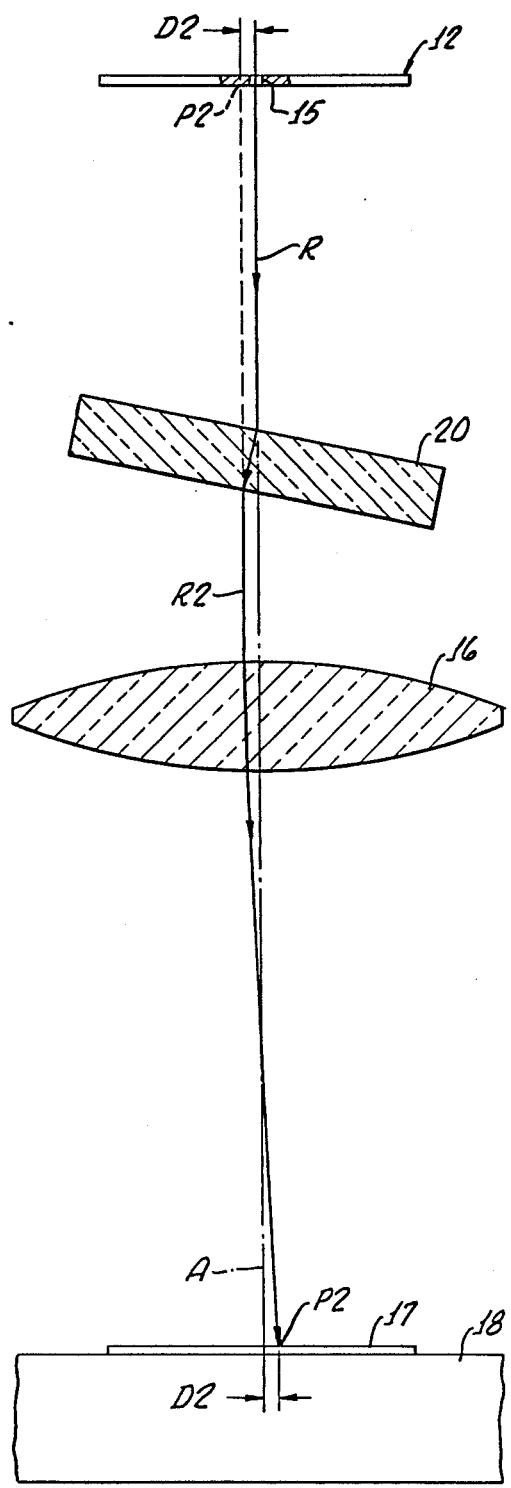
FIG. 2a corresponds to FIG. 2 but shows in exaggerated generalized manner the change in optics when the disc is tilted at a smaller angle relative to the reference plane.

Proceeding first to a description of the optical portions of the preferred embodiment of the method, reference will be made to the diagrammatic, exaggerated and not-to-scale drawings of FIGS. 2 and 2a. Reference will also be made to a ray or rays passing through the center hole 15 in mask 12, such hole 15 being on the optical axis of the laser and the projection lens 16. In FIG. 2, disc 20 is shown as being inclined or tilted to a relatively large angle to the reference plane (which plane is perpendicular to the optical axis). In FIG. 2a, disc 20 is shown as being tilted to a smaller angle to such plane.

Referring first to FIG. 2, during each laser pulse a ray R passes through the center of hole 15 down the optical axis A of the system. Ray R is refracted by disc 20, and emerges from the lower face of such disc as a ray portion R1 that is offset from and parallel to the upper region of ray R. Ray portion R1 passes through the imaging lens 16, crosses optical axis A, and strikes the upper surface of substrate 17 at a point P, to perform an ablating function as described below. If the disc 20 were not present, ray R would strike substrate 17 at axis A. The amount of offsetting, of point P from axis A, which is effected by disc 20 is represented at D at the lower portion of FIG. 2. Also, the convention is adopted that such offsetting appears as a virtual image at the mask 12, the virtual image of point P being likewise offset a distance D at such mask as indicated by the dashed line at the upper portion of FIG. 2.

When disc 20 is rotated as described above, point P describes a circle on the upper surface of substrate 17, with optical axis A the center of such circle.

Referring next to FIG. 2a, the disc 20 is inclined or tilted at a smaller angle, which means that the ray portion R2 is offset a lesser distance from ray portion R and from the optical axis. Thus, the point P2 at substrate 17 is spaced a smaller distance D2 from axis A than is the case relative to the relationship shown in FIG. 2. Accordingly, when disc 20 is rotated, the point P2 describes a circle having a smaller diameter than the circle described by point P of the FIG. 2 relationship.

Proceeding next to a description of the remaining portions of the method of the preferred embodiment, the excimer laser 10 is operated to project a beam having a fluence level sufficiently high to ablate organic polymer coating material from the upper surface of workpiece 17, at places where the image of openings 14, 15 is projected. To state one example, where the organic polymer is a polyimide, the excimer laser 10 is preferably caused to deliver a beam the fluence level of which is 70 to 100 mJ/cm$^2$ per pulse, reference being made to the above-cited article. The pulse repetition rate may vary considerably, an exemplary rate being 300 pulses per second.

Prior to the time laser 10 is operated, quartz disc 20 is angularly adjusted to a predetermined desired angle relative to the reference plane. Such predetermined angle is selected to cause the angle of the wall at the edge of the ablated polymer to be as desired by the manufacturer, normally within the range of about 45° to about 50° from the reference plane. In addition, motor M is operated to drive ring 22 and thus disc 20 at a desired speed that is correlated to the pulse repetition rate of the laser 10. For the 300 Hz exemplary repetition rate of laser pulses, an exemplary rate of rotation of the disc 20 is 3 revolutions per second, thus causing 100 pulses to pass through the disc 20 during each rotation of the disc. It is to be understood, however, that the rate of rotation of the disc may vary widely, for example between 60 and 600.

The minimum desired rotation speed is a function of the desire to have at least one complete disc rotation during each ablation burst (typically 200 to 300 pulses).

The maximum desired rotation speed results from the desire that the angular separation between pulses not be excessive. Preferably, the rotation speed and the pulse repetition rate are so correlated to each other that each ablation burst will begin and end at the same rotated position of the disc.

Because the disc is at a constant angle to the reference plane, for any desired degree of inclination of the disc and as described above relative to FIGS. 2 and 2a, the refraction effected by the disc offsets the beam a predetermined constant amount regardless of the rotated position of the disc. The image of each spot or point in those beam portions which pass through openings 14, 15 thus orbits in a small circle on the upper surface of workpiece 17, the rate of orbiting corresponding to the rate of rotation of disc 20. The radius of each orbit varies with disc inclination, as described above.

With each spot in the beam thus orbiting, the entire image of the openings 14, 15 moves accordingly-. The result is that the outer regions of the area on workpiece 17 against which is projected that beam portion which passed through mask hole 15 (for example) receive less laser pulses than do the inner regions of the workpiece area impinged against by that same beam portion.

Openings are thus ablated in the organic polymer at the upper part of workpiece 17 to form ablated regions 14a and 15a corresponding to openings 14, 15 in the mask. Each region 14a and 15a is defined by a wall at the edge of the ablated portion of the polymer, and this wall is inclined downwardly and inwardly at an angle determined by the amount of offsetting of the image (which, in turn, is determined by the angle of the disc 20 and the thickness thereof).

As an example, pulses from laser 10 will always, during each ablation burst, impinge against the workpiece 17 at the central region of the image 15a of hole 15. Conversely, pulses forming the image of the edge of hole 15 will be projected onto workpiece 17 more frequently toward the center of image 15a than they will toward the periphery of such image. Accordingly, the wall of the ablated region 15a on workpiece 17, corresponding to hole 15 in the mask, will be inclined at an angle correlated to the amount of refraction effected by disc 20.

It is emphasized that the disc 20 does not affect the fact that the beam is sharply focused on workpiece 17.

The thickness and angle of disc 20 are so selected that the amount of refraction is small in comparison to the diameters (or widths) of the openings 14, 15 in mask 12. Stated otherwise, it is not desired that the image of hole 15 (for example) travel around (in its entirety any large-diameter circle. Instead, the method provides for a small amount of refraction, the offsets D and D2 (FIGS. 2 and 2a) being sufficiently small that central regions of the image of each mask opening will be ablated more extensively than will peripheral regions thereof.

It is pointed out that the disc 20 is so thin, and the angle of the disc relative to the reference plane so small, that the amount of offset D, etc., is normally very small. Typical offsets range from 5 to 10 microns.

Referring next to FIG. 5, a metallic substrate 26 is shown as being coated on its upper surface with an organic polymer dielectric 27, for example a polyimide. The polymer 27 has been ablated by the present method and apparatus, so that a via opening 15a (an exemplary one corresponding to mask hole 15) is provided in the polymer and is sufficiently deep that the upper surface of substrate 26 is exposed. Relative to the article of FIG. 5, the polymer has been so ablated by the present invention that the wall angle of the polymer edge region or wall 31 defining the via opening 15a (for example) is at an angle between 45° and 50° to the reference plane. Where the via opening is made in response to the circular hole 15 in mask 12 (FIG. 1), the wall or edge region 31 is a downwardly convergent cone.

A via is formed by evaporating metal from a source at a distance from the workpiece 17, the distance being sufficient that the metal atoms or molecules travel substantially parallel to each other, and perpendicularly to the workpiece, when they strike the wall 31 and also strike the substrate surface portion defined within wall 31. As a result, a metal coating 32 is provided on the upper surface of the polymer both at wall 31 and around the upper region thereof, and also on the upper surface of substrate 26 defined within the bottom region of wall 31. It is to be noted that the coating is more thick at its upper and lower regions than it is on inclined wall 31.

To reduce the size of each via, the present invention is so performed that the angle of wall 31 relative to the reference plane is made somewhat smaller than is shown in FIG. 5, but not so small that sufficient metal will not adhere to wall 31.

In some processes, no conduction at all may be desired, in which case the motor M is stopped and/or the angle of disc 20 relative to the reference plane is caused to be zero.

It is to be understood that the substrate 26 is typically part of an electrical circuit pattern, and that a second layer of circuit board is provided above the upper surface of polymer 27 in electrical contact with the metal coated on such upper surface. Accordingly, electrical connection is completed between the two circuit layers by the coating 32 that is on wall 31 and near such wall.

DESCRIPTION OF PREFERRED EMBODIMENT OF THE APPARATUS

The quartz disc 20 presently employed by the inventor is 1 mm thick. It is tilted in a range of a fraction of a degree to 10°, and rotated, by apparatus described below.

Referring to FIG. 3, a suitable frame 36 receives the housing 37 of projection lens 16, both the frame and the lens housing being suitably supported by means, not shown. A variable-speed motor 38 is connected through gearing 39 to an output shaft 41 on which is fixedly mounted a pulley 42. A belt 43, for example an O-ring, is mounted in a peripheral groove in pulley 42 and in a peripheral groove in a rotary table 44, the latter being disposed above lens housing 37 and coaxial therewith. Table 44 rotates on bearings 44a seated on a collar portion of the frame. An opening in table 44, and in frame 36, permits transmission to the lens of the laser beam.

Pivotally mounted on the upper surface of table 44 is a disc plate 45, this being illustrated as being a round flat plate having a central opening 46 in which is fixedly mounted in coplanar relationship the refracting disc 20. The pivot means comprises two balls 47 centered in the reference plane, and preferably spaced equal distances on opposite sides of the vertical central plane of the apparatus (FIG. 4). The upper region of each ball is seated in a close-fit precision opening in the underside of disc plate 45, and the lower region of each ball is seated in a precision opening in the upper surface of rotary table 44.

An adjustment set screw 48 extends through an opening in disc plate 45, opposite balls 47, being threaded in a nut 49 that is welded to the upper surface of the plate. The bottom end of the set screw 48 rests on the upper surface of the rotary table, the result being that turning of the set screw determines the angle of the disc plate relative to the reference plane. To keep everything in position, while still permitting adjustment of disc plate angle as described, two bolts 50 are extended through oversize openings in disc plate 45 and threaded into table 44, the bolts being outboard of balls 47, and being somewhat closer to set screw 48 than are the balls 47. Helical compression springs 51 are seated between the bolt heads and the upper surface of the disc plate to urge the latter downwardly at all times.

It is to be understood that the apparatus described in reference to FIGS. 4 and 5 is disposed in the system of FIG. 1 (and FIGS. 2 and 2a) between the mask and the workpiece, and preferably between the mask and the projection lens, in place of the elements 22-24 shown in such FIG. 1.

DESCRIPTION OF SECOND EMBODIMENT OF METHOD AND APPARATUS

Figure 6:
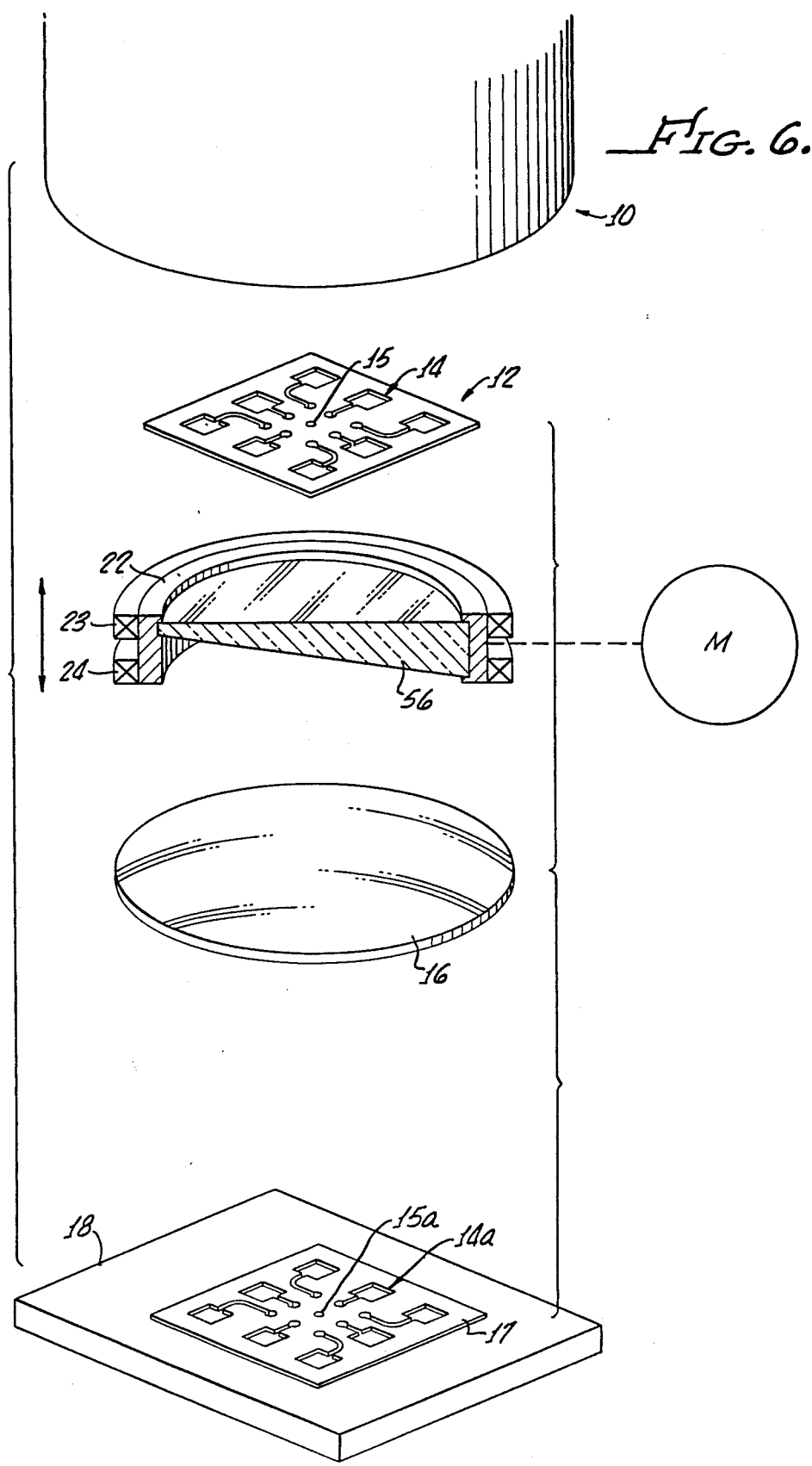
FIG. 6 is a view corresponding to FIG. 1 but showing the prism employed in a second embodiment of the invention.
Figure 7:
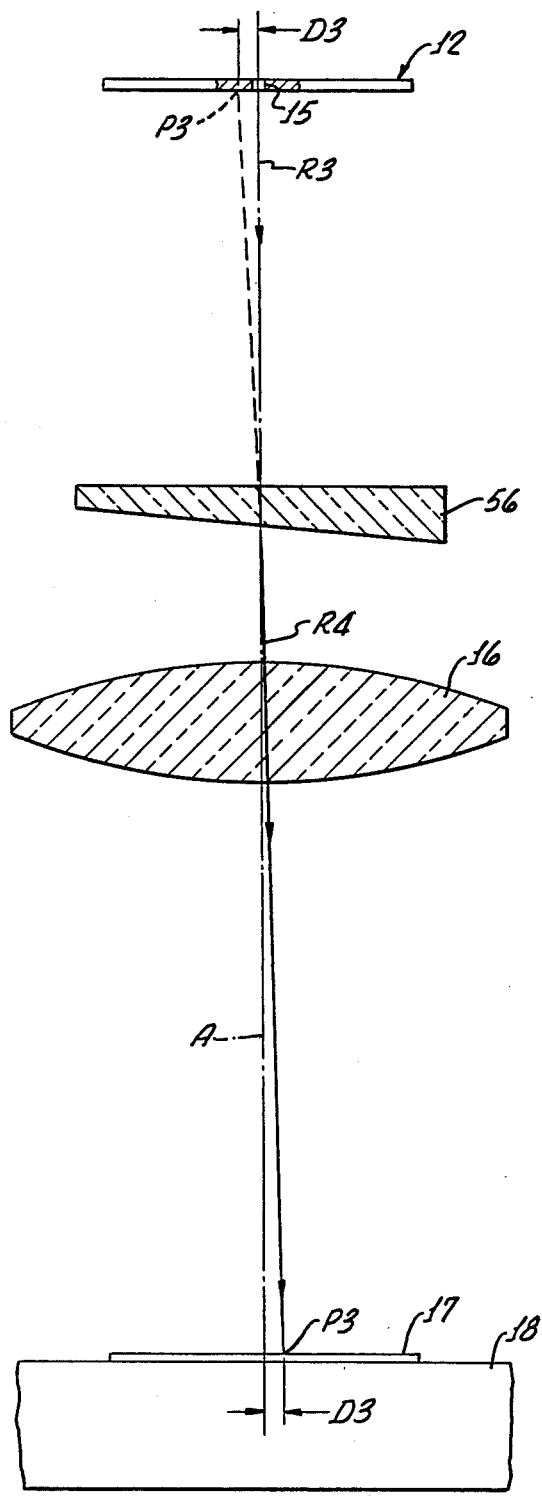
FIG. 7 is a diagrammatic drawing, not to scale, showing in exaggerated generalized manner the optics of such second embodiment when the prism is in one elevated condition.
Figure 7A:
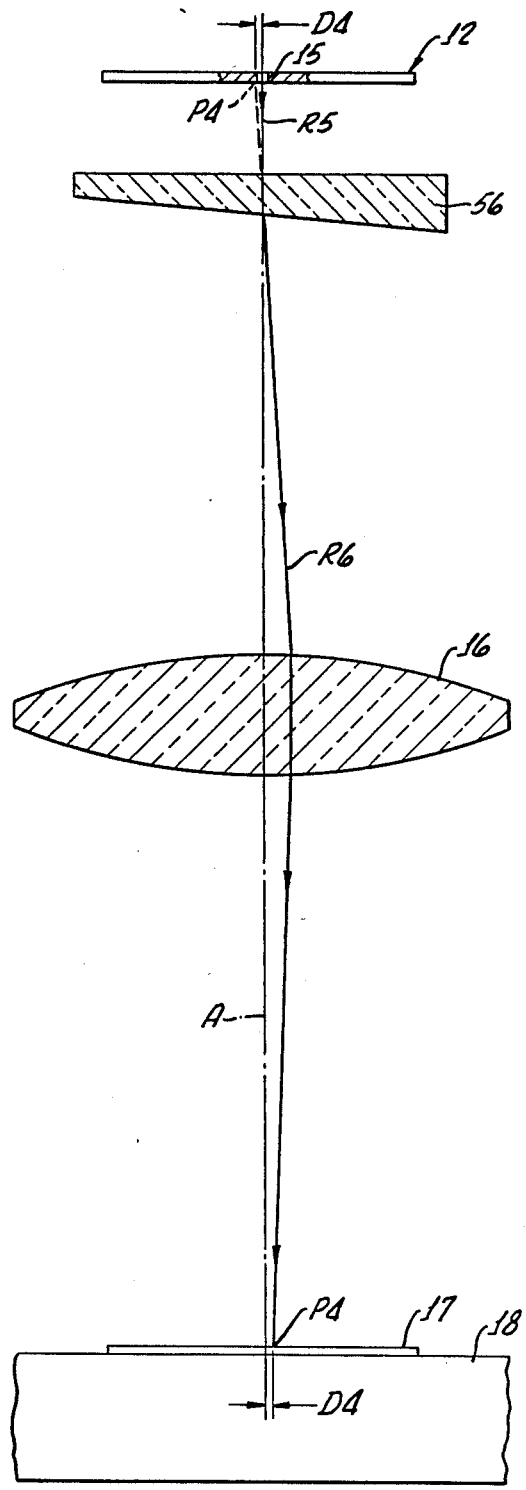
FIG. 7a corresponds to FIG. 7 but shows in exaggerated generalized manner the change in optics when the prism is elevated to a higher position.

Except as specifically stated, the second embodiment of the method and apparatus is identical to the first embodiment; accordingly, except where stated the above description applies also to the second embodiment Referring to FIGS. 6, 7 and 7a, the second embodiment employs a prism 56 (or wedge) instead of the refractive element 20 having parallel faces. In the drawings of FIGS. 7 and 7a, the prism (and other parts) are shown diagrammatically-, not to scale and in exaggerated form. Preferably, the prism is thin, and therefore——and because it is preferably formed of quartz—absorbs very little ultraviolet light from the excimer laser.

In the illustrated embodiment, the prism has a top face that is parallel to the reference plane (which plane is perpendicular to the optical axis) and a bottom face that is inclined relative thereto. It is to be understood that either or both of the top and bottom faces could be inclined relative to such plane, provided the faces are not parallel to each other. (It is also pointed out that different-thickness discs, and in some instances different-thickness prisms, could be employed in both embodiments to change the degree of offsetting of the laser beam. This, however, is not preferred. It would also be possible, but not desired, to vary the displacement D, etc., by varying the projection lens. For example, instead of using a 1:1 lens, a 1:0.6 lens could be substituted to change the displacement accordingly.)

As shown in FIG. 7, a ray R3 from laser 10 passes through hole 15 in mask 12, along the optical axis A. Because the exemplary ray R3 is on the optical axis, and the top face of the illustrated prism 56 is perpendicular to such axis, the ray is not refracted at the top surface but only at the bottom. At the bottom surface, the ray is refracted toward the right, and passes downwardly through lens 16 and thence to the substrate 17, striking the latter at point P3. Because the prism 56 in FIG. 7 is spaced a relatively long distance from mask 12, the point P3 is spaced a larger distance from optical axis A than is the case relative to point P4 described below relative to FIG. 7a.

FIG. 7a shows the prism 56 at a relatively high elevation, substantially less spaced from mask 12 than is the case relative to the arrangement of FIG. 7. Accordingly, the ray portion R6 passing out the bottom face of prism 26 has much more space in which to deflect than is the case relative to the arrangement of FIG. 7. It follows that when the ray portion R6 reaches projection lens 16 it is spaced much farther from axis A than is the case relative to FIG. 7. The lens then bends the ray back until it strikes the substrate at point P4 that is closer to optical axis A than in the FIG. 7 situation. In FIGS. 7 and 7a, the convention is again used that a virtual image of point P3 or P4 appears at the mask.

Relative to both FIG. 7 and FIG. 7a, rotation of the prism 56, preferably about an axis parallel or coincident to optical axis A, causes the point P3 or P4 to describe a circle on the upper substrate surface, about the axis A.

As is the case relative to both of the described embodiments, all portions of the beam that pass through mask 12 describe corresponding circles, that is to say have corresponding orbits. In the second embodiment, the diameters of the circles or orbits are determined by the elevation of prism 56 as well as by the fixed characteristics of such prism—namely the angle between the two faces.

In the preferred apparatus and method relative to the second embodiment of the invention, the angle between the faces of prism 56 is made extremely small. A preferred angle is 0.01146 degree. With such a small angle, or other small angles, the amount of offsetting of the beam is very small as desired.

To state two specific examples, if the angle between the prism faces is the stated 0.01146 degree, and the distance between the lower prism face and the mask is 100 mm, the displacement D3 is 10 microns. If, however, such distance from prism to mask is reduced to 50 mm, then displacement D4 decreases to 5 microns.

The amount of offsetting effected by the prism 56 is so small that the image on the substrate 17 is not caused to become out of focus. Stated in another manner, the effect of the prism 56 is caused to be within the depth of focus of the system. Accordingly, the above-indicated disadvantages relative to defocusing of the system do not occur.

It is pointed out that the offset D3 that results when the parts are in the position of FIG. 7, or the offset D4 that results when the parts are in the position of FIG. 7a, or other offsets, could be achieved in a manner additional to moving the prism 56 upwardly or downwardly. Such prism could also be inclined, by the method and apparatus described relative to FIGS. 1-4, to achieve offsetting in a compound manner.

In the present specification and claims, the word "disc" is used only as a convenience, since such word is employed to denote a sheet of transparent quartz (or other refracting material) having any peripheral shape. If the present specification and claims, the "prism" definition is employed whereby the word denotes an optical element having two nonparallel surfaces and which is used to refract light. In the present specification and claims, the word "opening" relative to the mask denotes an optical opening, which may or may not have a transparent element across it.

The foregoing detailed description is to be clearly understood as given by way of illustration and example only, the spirit and scope of this invention being limited solely by the appended claims.

What is claimed is:

1. A method of controlling the wall angle of an edge region of a substance being ablated by pulses from an excimer laser, said method comprising:

(a) providing an excimer laser system including an excimer laser, a mask, a projection lens, and a workpiece to be ablated, and (b) substantially continuously displacing the beam from said laser, at a region between said mask and said workpiece, in such manner that the displaced beam strikes said workpiece and progressively ablates portions thereof corresponding to the shape of openings in said mask, and in such manner that the wall angle at the edge of an ablated region of said workpiece is determined by said displacement.

2. The invention as claimed in claim 1, in which said method further comprises varying the amount of said continuous displacement in such manner as to control the wall angle at the edge of a region of said workpiece ablated by said beam.

3. The invention as claimed in claim 1, in which said method further comprises employing as said workpiece a substrate coated with organic polymer dielectric, whereby said ablated region is part of said organic polymer dielectric.

4. The invention as claimed in claim 1, in which said method further comprises at all times, during said ablation, maintaining said excimer laser system in such relationship that the image of said openings in said mask is focused on said workpiece.

5. In ablation process in which an excimer laser is employed to pass pulses through a mask having openings therein , and then through a projection lens onto a workpiece to be ablated, the improvement comprising:

(a) interposing a refractive disc between said mask and said workpiece, (b) tilting said disc to a desired angle relative to a reference plane that is perpendicular to the optical axis of said laser and said projection lens, (c) rotating said tilted disc to cause each part of the mask image on said workpiece to orbit in a circle the diameter of which is determined by the amount of displacement of said beam effected by said tilted disc, and (d) so selecting the thickness and tilt angle of said disc that the wall of an edge portion of workpiece material ablated by said beam is at a predetermined desired angle to said reference plane.

6. The invention as claimed in claim 5, in which said method further comprises maintaining said image focused on said workpiece at substantially all times during the ablation.

7. The invention as claimed in claim 5, in which said method further comprises effecting said rotation of said tilted disc about an axis parallel to or coincident with said optical axis.

8. The invention as claimed in claim 5, in which said method further comprises employing as said refractive disc a disc having parallel upper and lower surfaces and a thickness in the range of about 0.5 mm to about 3 mm.

9. The invention as claimed in claim 5, in which said method further comprises effecting said tilting to an angle in the range of a fraction of a degree to about 10° relative to said reference plane.

10. The invention as claimed in claim 5, in which said method further comprises rotating said disc at a rate in the range of about 60 to about 600 RPM.

11. The invention as claimed in claim 5, in which said method further comprises employing as said refractive disc a disc having parallel upper and lower surfaces and a thickness in the range of about 0.5 mm to about 3 mm, effecting said tilting to an angle in the range of about a fraction of a degree to about 10° relative to said reference plane, and rotating said disc at a rate in the range of about 60 about 600 RPM.

12. The invention as claimed in claim 5, in which the diameter of orbit of each part of the image on said workpiece is caused to be smaller than the diameter of the smallest-diameter opening in said mask.

13. The invention as claimed in claim 5, in which said method further comprises employing as said workpiece a substrate having an organic polymer coating thereon.

14. The invention as claimed in claim 5, in which said method further comprises employing as said workpiece a circuit board having a substrate coated with an organic polymer dielectric.

15. The invention as claimed in claim 14, in which said ablating is continued until a via opening is formed in said dielectric to expose a part of said substrate.

16. The invention as claimed in claim 15, in which said method is so performed that the edge of said dielectric defining said via opening has a wall angle relative to said reference plane of about 45° to about 50°.

17. The invention as claimed in claim 5, in which said method further comprises employing as said refractive disc a disc having parallel upper and lower surfaces.

18. In an ablation process in which an excimer laser is employed to pass pulses through a mask having openings therein, and then through a projection lens onto a workpiece to be ablated, the improvement comprising:

(a) interposing a prism between said mask and said workpiece, said prism having nonparallel faces at a small angle to each other, (b) rotating said prism to cause each part of the image on said workpiece to orbit in a circle the diameter of which is determined by the amount of displacement of said beam effected by said prism, and (c) so selecting and locating said prism that the wall of an edge portion of workpiece material ablated by said beam is at a predetermined desired angle to a reference plane that is perpendicular to the optical axis.

19. The invention as claimed in claim 18, in which said method further comprises changing the distance between said prism and said mask to thereby vary said amount of displacement.

20. The invention as claimed in claim 18, in which said method further comprises tilting said prism to a desired angle relative to said reference plane, to thereby vary said amount of displacement of said beam.

21. The invention as claimed in claim 18, in which said method further comprises employing as said prism a prism having faces disposed at an angle of less than one degree to each other.

22. The invention as claimed in claim 18, in which said method further comprises so selecting and locating said prism that the image is maintained focused on said workpiece at substantially all times during the ablation.

23. Apparatus for effecting selective ablation of printed circuit boards and other workpieces, said apparatus comprising:

(a) an excimer laser, (b) a mask, (c) a projection lens, (d) a workpiece table, and (e) a beam-displacing and moving apparatus disposed between said mask and said table, said beam-displacing and moving apparatus comprising a transparent disc tilted at a small angle to a reference plane that is perpendicular to the optical axis of said laser and said projection lens, said beam-displacing and moving apparatus further comprising means to rotate said tilted disc about an axis substantially parallel to or coincident with said optical axis.

24. The invention as claimed in claim 23, in which means are provided to vary the amount of tilting of said disc relative to said reference plane.

25. The invention as claimed in claim 23, in which said disc is a quartz disc having a thickness in the range of about ½ mm to about 3 mm, said quartz disc having faces parallel to each other.

26. The invention as claimed in claim 23, in which said disc is a prism having faces oriented at an angle of less than one degree relative to each other.

* * * * *